(12) United States Patent
Edström

(10) Patent No.: US 6,580,900 B1
(45) Date of Patent: Jun. 17, 2003

(54) TUNING ARRANGEMENT

(75) Inventor: Lars Edström, Hässelby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/492,284

(22) Filed: Jan. 27, 2000

(30) Foreign Application Priority Data

Jan. 27, 1999 (SE) .............................................. 9900248

(51) Int. Cl.[7] ................................................. H04B 1/04
(52) U.S. Cl. ........................ 455/125; 455/120; 455/115
(58) Field of Search ................................. 455/115, 120, 455/121, 123, 125, 77, 561

(56) References Cited

U.S. PATENT DOCUMENTS

| 4,215,312 A | * | 7/1980 | Takayama ................... 455/284 |
|---|---|---|---|
| 5,374,905 A | * | 12/1994 | Larsson et al. .............. 455/125 |
| 5,408,688 A | | 4/1995 | Saldell ......................... 455/77 |
| 5,493,710 A | * | 2/1996 | Takahara et al. ......... 455/192.2 |
| 5,638,034 A | | 6/1997 | Heikkilä et al. ............. 455/125 |
| 6,041,083 A | * | 3/2000 | Larsson et al. .............. 455/121 |
| 6,246,727 B1 | * | 6/2001 | Larsson et al. .............. 455/115 |

FOREIGN PATENT DOCUMENTS

EP 0 494 058 7/1992

* cited by examiner

*Primary Examiner*—Thanh Cong Le
*Assistant Examiner*—Thuan T. Nguyen

(57) ABSTRACT

A tuning arrangement tunes a resonance module for wireless applications, e.g., wireless communication for a base station for mobile telephony system. The input and the output power signals of the resonance module are derived and information bearing parts of the derived power signals are divided with each other to produce a ratio. The resonance module is tuned until the ratio reaches a minimum value.

11 Claims, 2 Drawing Sheets

US 6,580,900 B1

TUNING ARRANGEMENT

TECHNICAL FIELD

This invention relates essentially to a tuning arrangement for a resonance module, and particularly to a tuning arrangement for making a separate tuning of a resonance module for a wireless application, e.g. for wireless communication, for example in a base station for a mobile telephony system, the base station having a plurality of resonance modules (cavities), each of them being automatically controlled to its given resonance mode in relation to the frequency of an incoming signal and thus being provided with a separate tuning arrangement, below called measurement receiver.

Since the mobile telephony systems are getting more and more complicated due to demands to carry more and more information and to be more and more frequency effective the modulation wave-form has become very complex. Tuning algorithms for auto-tuning of combiners have to be very advanced in order to function properly.

U.S. Pat. No. 5,408,688 describes a mobile telephone system including base station with a plurality of resonance modules. Each module is to be separately adjusted to its own frequency for receiving and expediting telephone signals at this frequency. Tuning is controlled to its given resonance position in relation to the frequency of the incoming signal. This is done by a drive connected for obtaining drive voltage by phase comparison. When the phase is calibrated it goes through zero, as apparent from the curve B in FIG. 3 in U.S. Pat. No. 5,408,688. The demand is then that both the input and output ports and the wiring are carefully calibrated, otherwise it is not possible to have a minimum attenuation when the phase passes through zero. The calibration operation is quite difficult. This kind of system can not handle the varying power levels within the time gaps of today. Such demands were not actual at the filing date of that patent.

SUMMARY

The measurement receiver currently in use only measures the output signals of the resonance module. Therefore it is impossible to decide whether the change of power level depends on the actual tuning algorithm or on the modulation wave-form. The modulation wave-form of today has a power variation within the time gap, particularly in the modem TDMA systems, and it is expected that new systems to come have a further more variation within the time gap. Fast and accurate auto-tuning has therefore become impossible with the prior art systems.

An object of the invention is to provide an apparatus for making a fast and accurate auto-tuning of a resonance module.

Another object of the invention is to provide an apparatus for making an automatic and yet reliable tuning operation of a resonance module.

The objects above are solved by using an apparatus having the features in the characterizing part of claim 1. Further features and developments are disclosed in the rest of the claims.

The invention relates to a tuning arrangement for tuning a resonance module for wireless applications, e.g. for wireless communication, for example for a mobile telephony system, comprising means for deriving the input and the output power signals of the resonance module. The arrangement is characterized by means for dividing information bearing parts of the derived power signals with each other to have a ratio of them, and means for tuning the resonance module until the ratio has reached a minimum value. In this way the variation of the input and output of the resonance module cancel each other. An oscillator means is preferably setable to a frequency region adapted to the resonance module. A power detection and frequency counting means is preferably connected to derive the frequency and power of the input signal of the resonance module and set the oscillator means based on the output of the power detection and frequency counting means. First and second mixing means mix the derived input and the derived output, respectively, of the resonance module with an output of the oscillator means. A first filtering means filters the output of the first mixing means. A second filtering means filters the output of the second mixing means. A dividing unit to which the outputs of the filters are fed to an input each makes the ratio between its inputs to create an output being a signal independent of the signal variation of the input and output of the resonance module. A processing means makes a reciprocating adjustment of the resonance module until the output of the dividing unit lies on a minimum value.

By implementing a dual channel measurement receiver, i.e. a receiver which measures the input and the output of the resonance module coherently and computes their ratio, it is possible to deduce a signal which is proportional to the attenuation of the resonance module cavity. Any influence of the modulation scheme will be suppressed, since the output signal from the measurement receiver is the ratio of the input and output signals of the resonance module independently of any modulation wave-form. Hence the performance to the auto-tuning is improved significantly.

By using the principles according to the invention it is possible to provide a tuning operation on a mobile telephone system having power control per time gap, i.e. to handle varying power levels of the signal within the gap. This means during a time of ca some μsec, for example 3 à5 μsec, for a call in for example a TDMA system (TDMA=Time Division Multiple Access) and for future systems to come.

The measurement principle according to the invention to use a dual channel measurement receiver also eases the demands on the advanced tuning algorithms of today.

BRIEF DESCRIPTION OF THE DRAWINGS

For a more complete understanding of the present invention and for further objects and advantages thereof, reference is now made to the following description of an example of an embodiment thereof—as shown in the accompanying drawing, in which.

DETAILED DESCRIPTION OF EMBODIMENT

Figure 1:
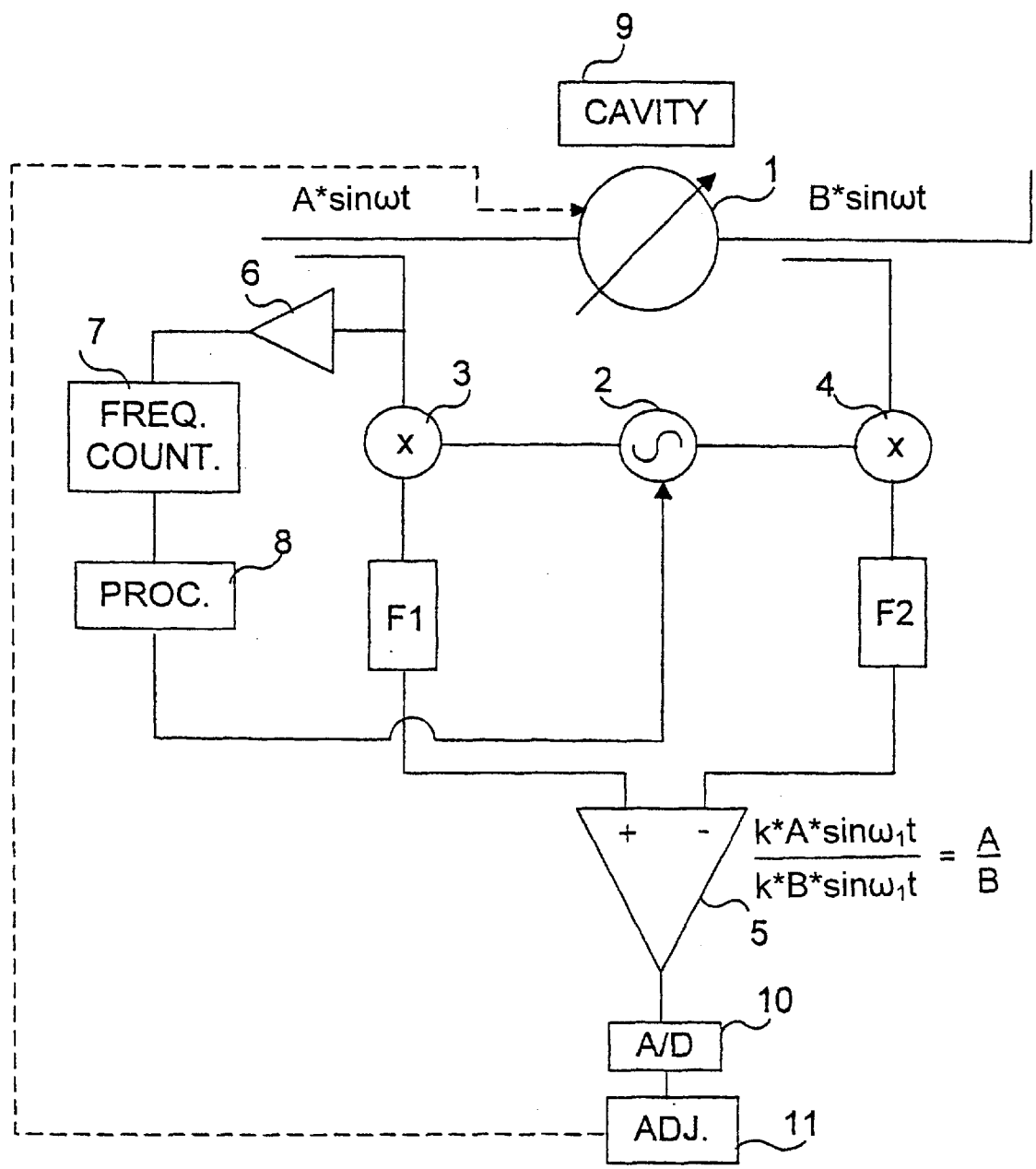
FIG. 1 shows a block diagram of an embodiment of the invention.

Referring to FIG. 1, a resonance module 1 is fed with an incoming signal A*sin ωt. The resonance module is to be tuned such that it provides an output B*sin ωt. The tuning is provided by deriving both the input and the output of the resonance module. A high-frequency oscillator 2 is controllable and has a frequency range in which the input signal to the resonance module 1 lies. An input signal mixer 3 mixes the derived input signal to the module 1 with the frequency of the oscillator 2 in order to have a frequency offset in relation to the derived frequency, which is high. An output mixer mixes the derived output signal from the module 1 with the frequency of the oscillator 2.

The output of the input mixer 3 is fed, via a first amplifier and filter F1, which makes a channel filtration and which can make a low-pass or a band-pass filtration, to a first input of a dividing unit 5. The output of the output mixer 4 is fed, via a second filter and amplifier F2, which can make a low-pass or a band-pass filtration, to a second input of the dividing unit 5. The dividing unit 5 provides the ratio between the inputs of the dual channel measurement receiver, i.e. the input and the output of the resonance module 1.

The input and output signals are thus to be compared with each other. Thus $(k*A \sin \omega_1 t)/(k*B \sin \omega_1 t)=A/B$ is the attenuation caused by the resonance module, the index '1' is used because the signals now have been mixed by the mixers 3 and 4, respectively. Also, the signals are proportional to the derived signals, which is indicated by the constant k. The resonance module 1 can then be tuned by the output of the dividing unit 5 so that a kind of bathtub-curve is received having its minimum attenuation at the tuned frequency.

The output of the dividing unit 5 is therefore analogue/digital converted in an A/D converter 10 and fed to an adjustment device 11 which calculates the tuning procedure, i.e. the tuning direction, and tunes the resonance module 1 in a reciprocating way, by adjusting stepping motors in the way well known for a person skilled in the art, until the output of the unit 5 has a minimum. Then the signal will be independent of the momentary actual power of the signal. It is to be noted that the relationships stated above will fit better when the tuning approaches the correct tuning value.

The kind of modulation has no influence on the signal transfer since there is only a signal ratio. The output of the resonance module 1 thus has the same form as its input. There is in fact a small time delay between the output and the input but this delay is very small in relation to the modulation changes and is filtered away using a low-pass filter at the output side of the resonance module.

The power of the input to the resonance module 1 is detected by a circuitry comprising an amplifier 6, a frequency counter 7 to make a frequency division of the input signal and a processing unit 8 which calculates the power and the frequency to which the resonance module 1 is to be tuned. The output of the processing unit 8 is fed to an input of the frequency generator 2 to adjust the generator to the centre frequency of the filters F1 and F2 in relation to the actual frequency channel. It is to be noted that a lot of channels (for instance 8, 12, 16, 32 etc. channels) are adjustable separately in this way.

Thus, by implementing a dual channel measurement receiver which measures both the input and output of the resonance module 1 coherently and computes the difference between the signals it is possible to deduce a signal which is proportional to the attenuation of a cavity 9. Any influence of the modulation scheme will be suppressed since the output of the module 1 is the ratio of both the input and the output of the module, i.e. both inputs to the dual channel receiver, independently of any modulation wave-form. Hence the performance of the auto-tuning can be improved significantly by the inventive measurement receiver in relation to prior art receivers.

This means also that the dual channel measurement receiver controls itself, i.e. is auto-controlled, and thus need not be controlled from another system. This kind of receiver does not need any calibration of the wiring etc. The dual channel measurement receiver can also handle the modulation type in the actual band width of the measurement receiver. The unit 5 produces the ratio between the derived signals from each side of the resonance module 1. The influence of the power changes, i.e. the modulation of the signal on each side of the resonance module, cancel each other, and it is easy for the processing means 11 to find the optimal tuning by tuning the resonance module 1 in small steps until the output of the unit 5 has reached a minimum.

The circuitry according to the invention could also be used to measure the power of the input signal and the output signal of the resonance module separately by deconnecting the one or the other of the deriving circuits. The output of the deriving unit 5 will then have a value in relation to the signal to be separately measured. This feature makes the dual channel measuring receiver still more useable.

Figure 2:
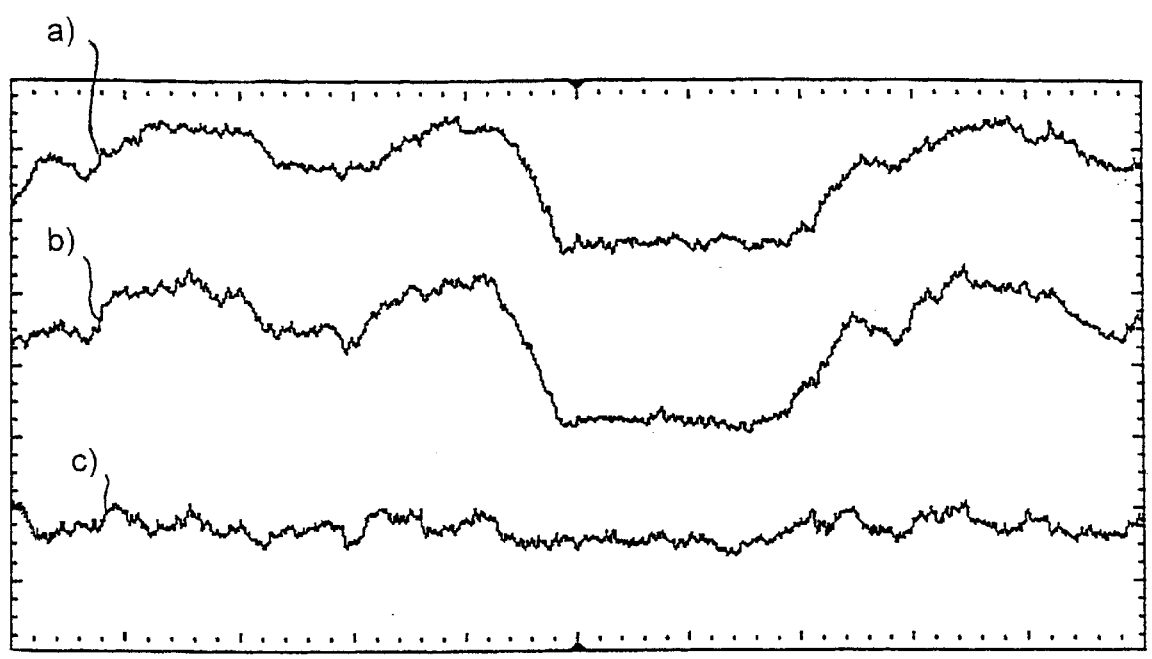
FIG. 2 shows a diagram of a) an input to the resonance module during a time gap, b) the output from the resonance module during the same time gap, and c) the output from the dual channel measurement receiver during the same time.

FIG. 2 shows diagrams recorded at a test with the circuitry according to the invention where the curve a) shows an input to the resonance module during a time gap, b) the output from the resonance module during the same time gap, and c) the output from the dual channel measurement receiver during the same time. The test were made after that the tuning of the resonance module 1 was finished. It is apparent that the effect of the signal variation is canceled so that only unavoidable noise on the signals is left in the output of the unit 5.

While the invention has been described with reference to specific embodiments, it will be understood by those skilled in the art that various changes may be made and equivalents may be substituted for elements thereof and different features described for one embodiment could be adequate also in the other embodiments without departing from the true spirit and scope of the invention as it is stated in the claims on file. In addition, modifications may be made without departing from the essential teachings of the invention as apparent from the claims.

We claim:

1. A tuning arrangement for tuning a resonance module for wireless applications, comprising means for deriving input and output power signals of the resonance module, means for dividing information bearing parts of the derived power signals with each other to produce a ratio, and means for tuning the resonance module until the ratio reaches a minimum value.

2. A tuning arrangement according to claim 1, further comprising oscillator means setable to a frequency region adapted to the resonance module.

3. A tuning arrangement according to claim 2, further comprising a power detection and frequency counting means connected to derive the frequency and power of the input signal of the resonance module, wherein the oscillator means is set based on the output of the power detection and frequency counting means.

4. A tuning arrangement according to claim 2, further comprising first and second mixing means for mixing the derived input and the derived output, respectively, of the resonance module with an output of the oscillator means.

5. A tuning arrangement according to claim 4, further comprising a first filtering means for filtering an output of the first mixing means and a second filtering means for filtering an output of the second mixing means, and a dividing unit to which the outputs of the filters are fed to and which produces a ratio between its inputs to create an output signal independent of a signal variation of the input and output of the resonance module.

6. A tuning arrangement according to claim 1, further comprising a processing means making a reciprocating adjustment of the resonance module until the output of the dividing unit lies at a minimum value.

7. A method for tuning a resonance module for wireless applications, comprising the steps of:

deriving input power signals of the resonance module, deriving output power signals of the resonance module, dividing information bearing parts of the derived power signals with each other to produce a ratio, and tuning the resonance module until the ratio reaches a minimum value.

8. The method according to claim 7, wherein the step of deriving input power signals of the resonance module comprises the steps of:

setting a setable oscillator means to a frequency region adapted to the resonance module, deriving the frequency and power of the input signal of the resonance module using a power detection and frequency counting means connected thereto, wherein the oscillator means is set based on the output of the power detection and frequency counting means.

9. The method according to claim 8, further comprising the steps of:

mixing the derived input of the resonance module with an output of the oscillator means, and mixing the derived output of the resonance module with an output of the oscillator means.

10. The method according to claim 9, further comprising the steps of:

filtering an output of the mixed derived input and the oscillator means, filtering an output of the mixed derived output and the oscillator means, and producing a ratio between the filtered outputs to create an output signal that is independent of a signal variation of the input and output of the resonance module.

11. The method according to claim 10, further comprising the step of making a reciprocating adjustment of the resonance module until the output signal that is independent of signal variation of the input and output of the resonance module lies at a minimum value.

* * * * *